United States Patent [19]

Misiano et al.

[11] Patent Number: 5,174,827
[45] Date of Patent: Dec. 29, 1992

[54] DOUBLE CHAMBER VACUUM APPARATUS FOR THIN LAYER DEPOSITION

[75] Inventors: Carlo Misiano; Enrico Simonetti, both of Rome, Italy

[73] Assignee: Consorzio Ce.Te.V Centro Tecnologie del Vuoto, Carsoli-l'Aquila, Italy

[21] Appl. No.: 863,389

[22] Filed: Apr. 3, 1992

Related U.S. Application Data

[63] Continuation of Ser. No. 537,512, Jun. 13, 1990, abandoned.

[30] Foreign Application Priority Data

Jul. 26, 1989 [IT] Italy .................. 48236 A/89

[51] Int. Cl.⁵ ............................................ C23C 16/00
[52] U.S. Cl. .................. 118/719; 118/704; 118/707; 118/715
[58] Field of Search ............... 118/663, 696, 704, 707, 118/715, 719; 204/298.25; 414/217

[56] References Cited

U.S. PATENT DOCUMENTS

| | | | |
|---|---|---|---|
| 4,725,204 | 2/1988 | Powell | 118/719 |
| 4,915,556 | 4/1990 | Stark et al. | 414/217 |
| 4,951,601 | 8/1990 | Maydan et al. | 118/719 |
| 4,961,832 | 10/1990 | Shagun et al. | 204/298.25 |
| 4,969,790 | 11/1990 | Petz et al. | 118/719 |
| 4,975,168 | 12/1990 | Ohno et al. | 204/298.25 |
| 5,016,562 | 5/1991 | Madan et al. | 118/719 |
| 5,020,475 | 6/1991 | Crabb et al. | 118/719 |

FOREIGN PATENT DOCUMENTS

| | | | |
|---|---|---|---|
| 63-315594 | 12/1988 | Japan | 118/719 |
| WO87/04414 | 7/1987 | PCT Int'l Appl. | 414/217 |

OTHER PUBLICATIONS

Budo, Y. et al., "Modular Vacuum System", IBM Technical Disclosure Bulletin, vol. 17, No. 8 (Jan. 1975) pp. 2268-2269.

Primary Examiner—Shrive Beck
Assistant Examiner—Terry J. Owens
Attorney, Agent, or Firm—Herbert Dubno

[57] ABSTRACT

An apparatus for thin layer vapor deposition has two horizontally spaced apart vacuum deposition chambers. Rearwardly and inwardly angled horizontal vacuum ducts are connected to the chambers, and a vacuum pumping device is connected to a further horizontal vacuum duct which communicates with the inwardly angled ducts. A computerized central system disposed between the chambers is operatively connected to the ducts and vacuum pumping device to enable either of the chambers to be used for set-up and evacuation while the other chamber is used for heating and deposition.

1 Claim, 2 Drawing Sheets

DOUBLE CHAMBER VACUUM APPARATUS FOR THIN LAYER DEPOSITION

This is a continuation of co-pending application Ser. No. 07/537,512 filed on 13 June 1990, now abandoned.

FIELD OF THE INVENTION

Our present invention relates to a double chamber vacuum apparatus for the deposition of thin layers.

More particularly, the invention relates to a plant usable in its best application to carry into effect thin-layer deposition of, for production, for research and for development.

BACKGROUND OF THE INVENTION

The previous techniques for thin-layers deposition, known to the inventors, are represented by monochamber apparatus, presenting the well known disadvantage of the impossibility to perform contemporaneous operations and all of the technical drawbacks of the deposition chamber.

In the event of failure, research and production had to be interrupted.

Moreover, when large amounts of work had to be done, additional plants were required, otherwise production was delayed.

SUMMARY OF THE INVENTION

These disadvantages are eliminated in a vacuum plant having more chambers utilizing only one central control system.

It is very important to mention that as to the plant economy, the control system is the most expensive part.

It is surprising that only one control system is capable of operating a plurality of vacuum chambers and results in a plant which is less expensive and easier to construct.

BRIEF DESCRIPTION OF THE DRAWING

The above and other objects, features and advantages of our invention will become more readily apparent from the following description, reference being made to the accompanying highly diagrammatic drawing in which.

SPECIFIC DESCRIPTION

Figure 1:
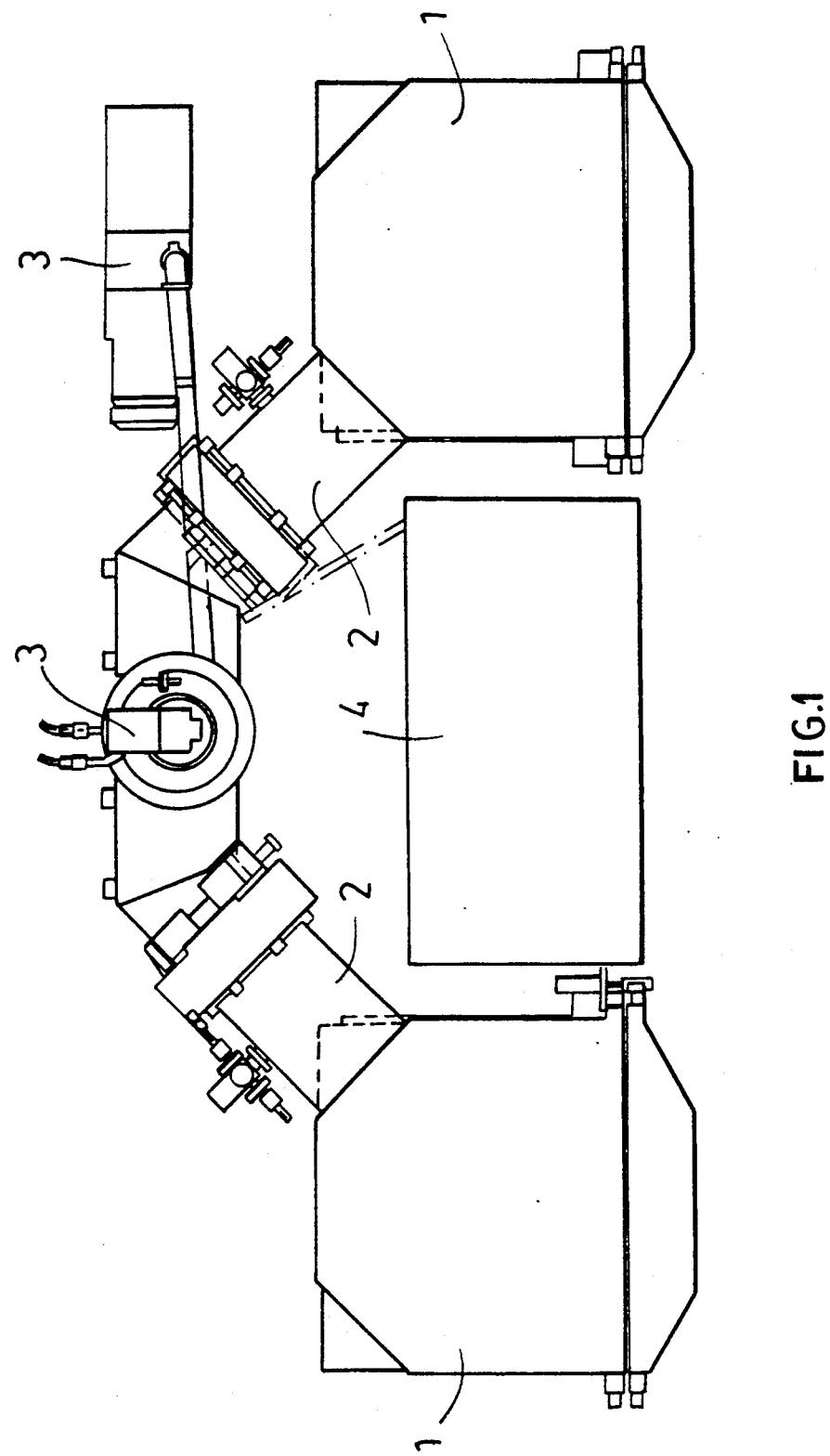
FIG. 1 is a plan view of the apparatus of the invention.

In the drawing we show two deposition chambers 1 connected by rearwardly and inwardly angled vacuum ducts 3 to a central pumping unit 3 which is connected to a computerized center system 4 for control of the operations and for effecting control of the process.

Figure 2:
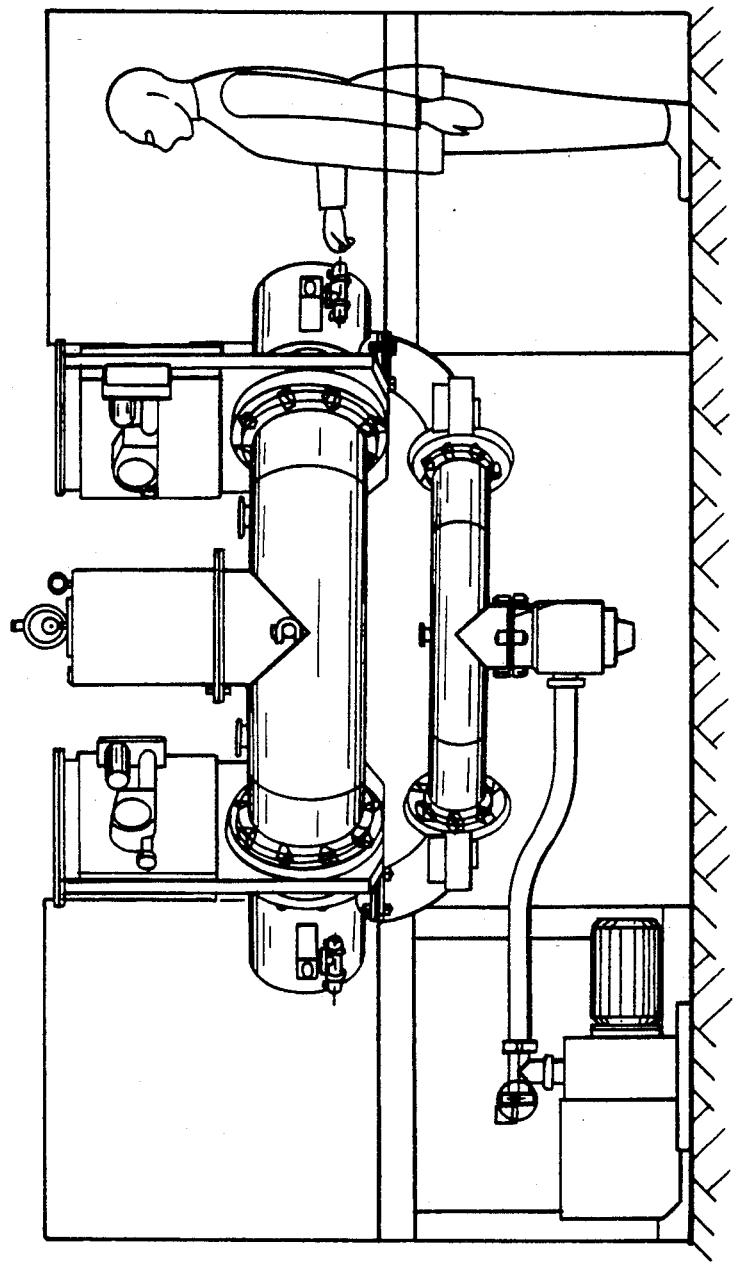
FIG. 2 is a front view thereof.

FIG. 2 shows a front view of the system, where without superfluous indications, appears clearly the connections between the pumping groups, deposition chambers, etc.

The method of utilizing the plate is essentially as follows: Into the two or more chambers are place the substrates on which the thin-layer deposition is carried out. During the deposition one chamber is used for the set-up and/or the evacuation, the heating and the eventual preparation to the process in the other deposition chambers or in others of the deposition chambers.

We underline that, although the figures show a plant with only two chambers, besides the control central system, the chambers could be several more.

In this case all the chambers have to be connected everyone to the central system.

We claim:

1. An apparatus for thin layer vapor deposition comprising:
   two horizontally spaced apart thin layer vacuum deposition chambers and having doors opening to a front of the apparatus;
   respective rearwardly and inwardly angled horizontal vacuum ducts connected to said chambers;
   a further horizontal vacuum duct between said inwardly angled vacuum ducts and communicating therewith;
   vacuum pumping means connected to said further horizontal vacuum duct and received between said inwardly angled vacuum ducts; and
   a computerized central system disposed between said chambers and operatively connected to said ducts and said pumping means for enabling one of said chambers to be used for set up and evacuation while the other of said chambers effects heating and deposition and vice versa, said central system lying forwardly of said ducts.

* * * * *